United States Patent
Chuang et al.

(10) Patent No.: US 11,983,351 B1
(45) Date of Patent: May 14, 2024

(54) TOUCH DETECTION DEVICE AND TOUCH DATA TRANSMISSION METHOD THEREOF

(71) Applicant: HIMAX TECHNOLOGIES LIMITED, Tainan (TW)

(72) Inventors: Chun-Kai Chuang, Tainan (TW); Jan-Ruei Lin, Tainan (TW); Yu-Hsiang Lin, Tainan (TW); I-Sheng Chao, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 18/183,162

(22) Filed: Mar. 14, 2023

Related U.S. Application Data

(60) Provisional application No. 63/434,942, filed on Dec. 23, 2022.

(51) Int. Cl.
*G06F 3/041* (2006.01)
*H03M 13/09* (2006.01)

(52) U.S. Cl.
CPC ........ *G06F 3/0414* (2013.01); *H03M 13/096* (2013.01)

(58) Field of Classification Search
CPC .......................... G06F 3/0414; H03M 13/096
USPC .......................................................... 345/173
See application file for complete search history.

(56) References Cited

U.S. PATENT DOCUMENTS

| | | | |
|---|---|---|---|
| 2016/0170548 A1* | 6/2016 | Suzuki | G06F 3/0416 345/174 |
| 2016/0338120 A1* | 11/2016 | Boyle | H04L 65/1069 |

\* cited by examiner

*Primary Examiner* — Calvin C Ma
(74) *Attorney, Agent, or Firm* — JCIPRNET

(57) ABSTRACT

A touch data transmission method of present disclosure includes: generating a header information by a first controller according to a detected touch event; generating a first checksum information by the first controller according to the header information; storing the header information and the first checksum information to a memory by the first controller; and, storing a plurality of position information of the detected touch event to the memory by the first controller.

12 Claims, 6 Drawing Sheets

TOUCH DETECTION DEVICE AND TOUCH DATA TRANSMISSION METHOD THEREOF

CROSS-REFERENCE TO RELATED APPLICATION

This application claims the priority benefit of U.S. provisional application Ser. No. 63/434,942, filed on Dec. 23, 2022. The entirety of the above-mentioned patent application is hereby incorporated by reference herein and made a part of this specification.

BACKGROUND

Technical Field

The disclosure relates to a touch detection device and a touch data transmission method thereof, and more particularly, to the touch data transmission method which can improve touch data transmission efficiency.

Description of Related Art

With the develop of electronic technology, electronic devices become commonly used tools in daily life of human. For providing convenience human-machine interface, a touch control panel is widely used.

Accordingly, in the conventional technology, touch event information obtained by the touch control device is always transmitted to a controller directly. If there is data loss during a transmission of the touch event information, the controller cannot identify the error of the touch event information. Such as that, the controller may perform wrong action caused by the wrong touch event information. An efficiency of the electronic device may be reduced.

SUMMARY

The disclosure provides a touch data transmission method of a touch detection device which can improve data transmission efficiency.

The touch data transmission method of present disclosure includes: generating a header information by a first controller according to a detected touch event; generating a first checksum information by the first controller according to the header information; storing the header information and the first checksum information to a memory by the first controller; and, storing a plurality of position information of the detected touch event to the memory by the first controller.

The touch detection device of present discloses includes a memory and a first controller. The first controller is coupled to the memory, and is configured to: generate a header information according to a detected touch event; generate a first checksum information according to the header information; store the header information and the first checksum information to the memory; and store a plurality of position information of the detected touch event to the memory.

Based on the above, in the touch data transmission method of present disclosure, header information and checksum operation are provided. The touch detection device may check the header information in advanced to check whether the touch event information is correct or not. Such as that, the touch event information can be quickly checked, wrong touch event information can be discarded, and error action of an electronic device caused by incorrect touch event information can be avoid.

DETAILED DESCRIPTION OF DISCLOSED EMBODIMENTS

Figure 1:
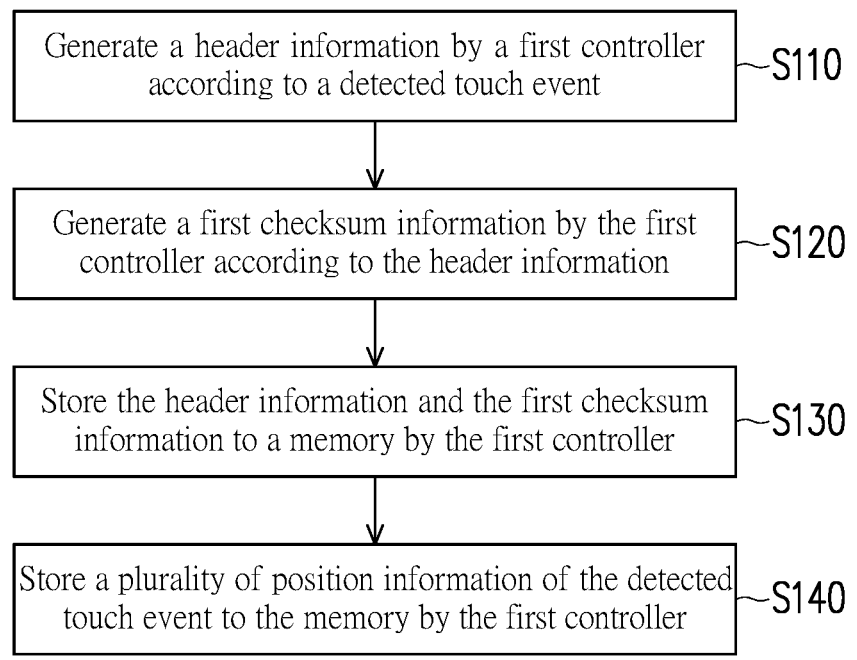
FIG. 1 illustrates a flow chart of a touch data transmission method according to an embodiment of present disclosure.

Please refer to FIG. 1, which illustrates a flow chart of a touch data transmission method according to an embodiment of present disclosure. In a step S110, if a touch event is detected, a header information can be generated firstly by a first controller of a touch detection device according to a detected touch event. Then, in a step S120, a first checksum information can be generated by the first controller according to the header information. In detail, in the step S110, the header information may be generated by a first controller according to a data length of touch event information of the touch detection event. The touch event information may include position information of one or more touched points, number of touch point(s) and touch type information of the detected touch event.

Figure 2:
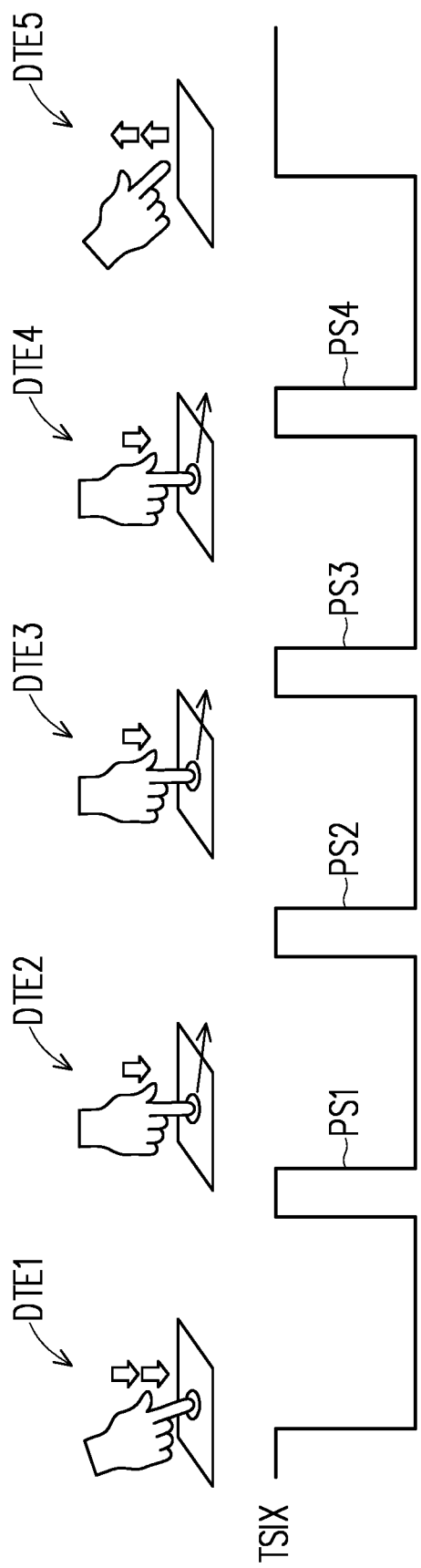
FIG. 2 illustrates a waveform plot of a trigger signal corresponding to a plurality of detected touch events according to an embodiment of present disclosure.

Please refer to FIG. 1 and FIG. 2 commonly, wherein FIG. 2 illustrates a waveform plot of a trigger signal corresponding to a plurality of detected touch events according to an embodiment of present disclosure. The trigger signal TSIX may be initialed at a high voltage value, such as a logic high value. Corresponding to a detected touch event DTE1, the trigger signal TSIX may be touched down to a low voltage value, such as a logic low value. In this embodiment, the detected touch event DTE1 is detected when a finger of an user touch down to a touch control panel. A second detected touch event DTE2 may be detected when the user keeps on touching the touch control panel for a predetermined time interval. Corresponding to the second detected touch event DTE2, a positive pulse PS1 can be generated on the trigger signal TSIX. If the user keeps on touch the touch control panel through the finger for enough long time length, a third to fifth detected touch events DTE3 to DTE5 can be obtained and positive pulses PS2 to PS5 can be generated on the trigger signal TSIX in sequence. After the positive pulse PS5, the user pulls up the finger, and a sixth detected touch event DTE6 can be obtained, the voltage value of the trigger signal TSIX may be pulled up to the high voltage value, such as logic high value.

According to transitions of the trigger signal TSIX, the first controller of the touch detection device may generate header information according to each of the transitions of the trigger signal TSIX corresponding to each of the detected touch events DTE1 to DTE6.

Figure 3:
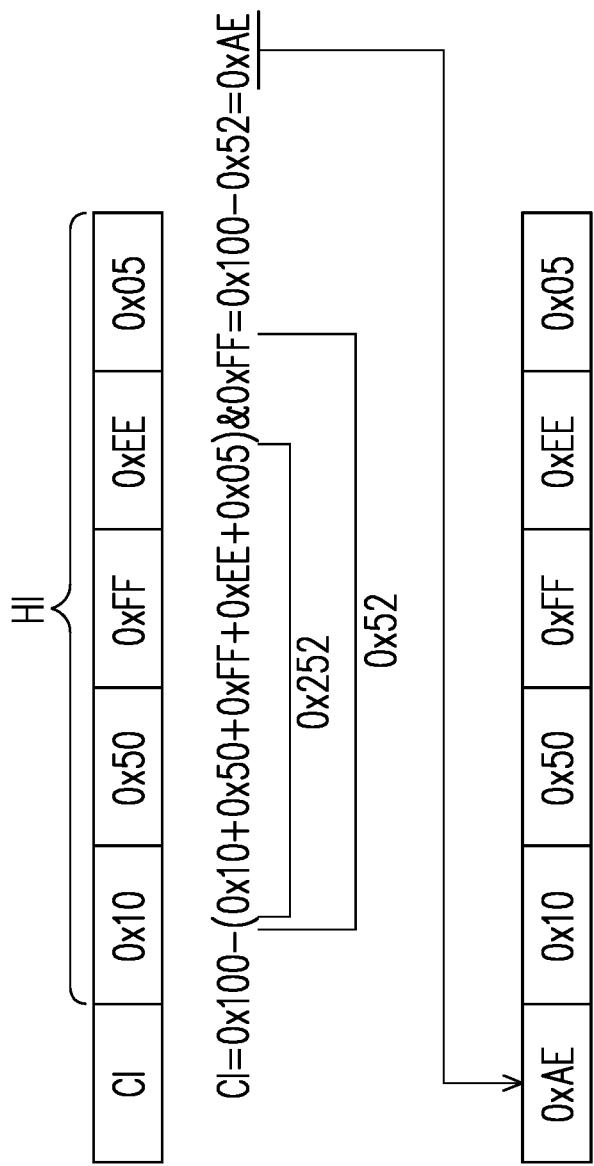
FIG. 3 illustrates a schematic plot for generating checksum information according to an embodiment of present disclosure.

About the checksum information, please refer to FIG. 3 which illustrates a schematic plot for generating checksum information according to an embodiment of present disclosure. In this embodiment, take the header information HI has 40 bits as an example. Logic value of the header information HI may be 0x10, 0x50, 0xFF, 0xEE and 0x05 in hexadecimal. The first controller may sum the header information HI bytewise to generate a first logic value, where the first logic value equals (0)(10+0x50+0xFF+0xEE+0x05)=0x252. Then, the first controller may pick up a preset bit length of the first logic value by performs an AND operation on the first logic value with 0xFF. In the embodiment, the preset bit length may be 8. Such as that, a second logic value equals 0x52 can be obtained by the first controller. Furthermore, the first controller may subtract a preset logic value by the second logic value to generate the checksum information CI. For example, if the preset logic value equals 0x100, the checksum information CI may equal 0x100−0x52=0xAE.

After the checksum information CI has been generated, refer to FIG. 1 again, the first controller may store the header information and the generated checksum information to a memory (in a step S130). Furthermore, the first controller may store a plurality of position information of the detected touch event to the memory in a step S140. The position information of the detected touch event may be coordinate values of a touch point of the detected touch event. In one embodiment, the coordinate values may include coordinate value of X-axis, coordinate value of Y-axis, and coordinate value of Z-axis, where the coordinate value of Z-axis may represent a touched area of the touch point of the detected touch event.

Please be noted here, in some embodiment, the first controller may also store touch type information and number of touch point of the detected touch event to the memory. For improve data reliability, the first controller may also generate another checksum information based on the position information, the touch type information and number of touch point of the detected touch event. The first controller may store the checksum information with the position information, the touch type information and number of touch point of the detected touch event into the memory.

Figure 4:
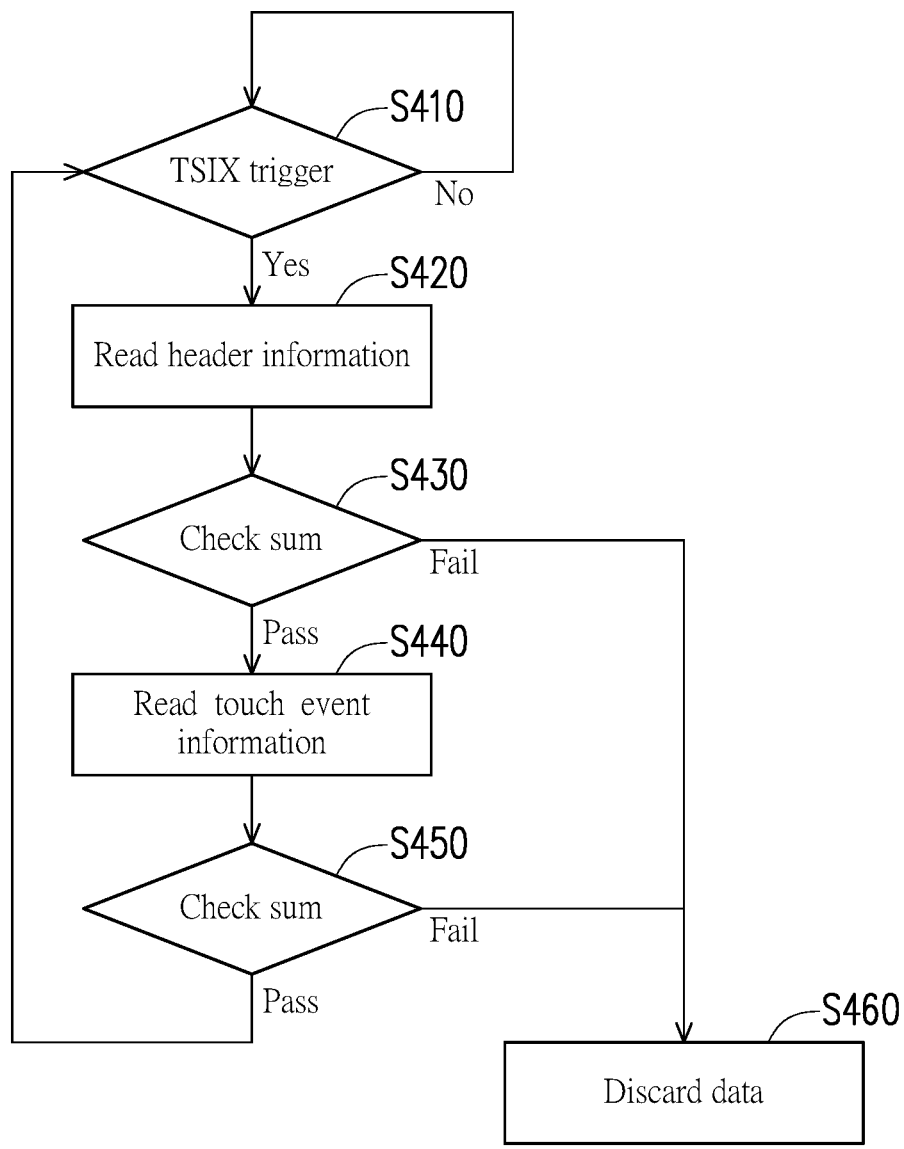
FIG. 4 illustrates a flow chart for a touch data transmission method according to another embodiment of present disclosure.

Please refer to FIG. 4, which illustrates a flow chart for a touch data transmission method according to another embodiment of present disclosure. In FIG. 4, whether a trigger signal TSIX is triggered or not can be detected by a second controller in a step S410. If at least one trigger event of the trigger signal TSIX has been detected, the second controller may identify a detected touch event, and the second controller may read a memory, wherein the memory is used to store a header information and corresponding checksum information. By reading the memory, the second controller may obtain the header information and corresponding checksum information of the detected touch event in a step S420. Then, the second controller may perform a check sum operation on the header information and corresponding checksum information of the detected touch event in a step S430. The second controller may calculate an expected checksum information according to the embodiment of FIG. 3, and the second controller may further compare the expected checksum information with the checksum information readout from the memory. If the expected checksum information is same as the checksum information readout from the memory, the check sum operation may be determined to be pass, and a step S440 can be performed. On the other hand, if the expected checksum information is different from the checksum information readout from the memory, the check sum operation may be determined to be fails, and a step S460 can be performed to discard data read from the memory.

If the check sum operation performed in the step S430 is pass, the second controller may read touch event information stored in the memory corresponding to the detected touch event. In a step S450, the second controller may perform another check sum operation on the touch event information and corresponding checksum information. In this embodiment, the touch event information may include position information, touch type information and number of touch point of the detected touch event, and the corresponding checksum information is generated based on the touch event information. By performing the check sum operation, data reliability of the touch event information can be confirmed by the second controller in the step S450. If the check sum operation has been determined to be passed, the second controller may obtain the touch event information which is correct by accessing the memory. On the other hand, if the check sum operation has been determined to be failed, the second controller may determine the touch event information is not correct and discard the touch event information in the step S460.

Please be noted here, in present embodiment, corresponding to the detected touch event, the second controller may first read the header information with the corresponding checksum information. By performing the check sum operation on the header information and the corresponding checksum information, if the check sum operation for the header information is failed, the second controller determines the touch event information in the memory may be not correct and the second controller may avoid to read the touch event information with low reliability from the memory.

Even when the check sum operation on the header information is passed, the second controller further performs the check sum operation on the touch event information. Such as that, correct touch event information can be obtained by the second controller, and the reliability of the touch event information can be confirmed.

Figure 5:
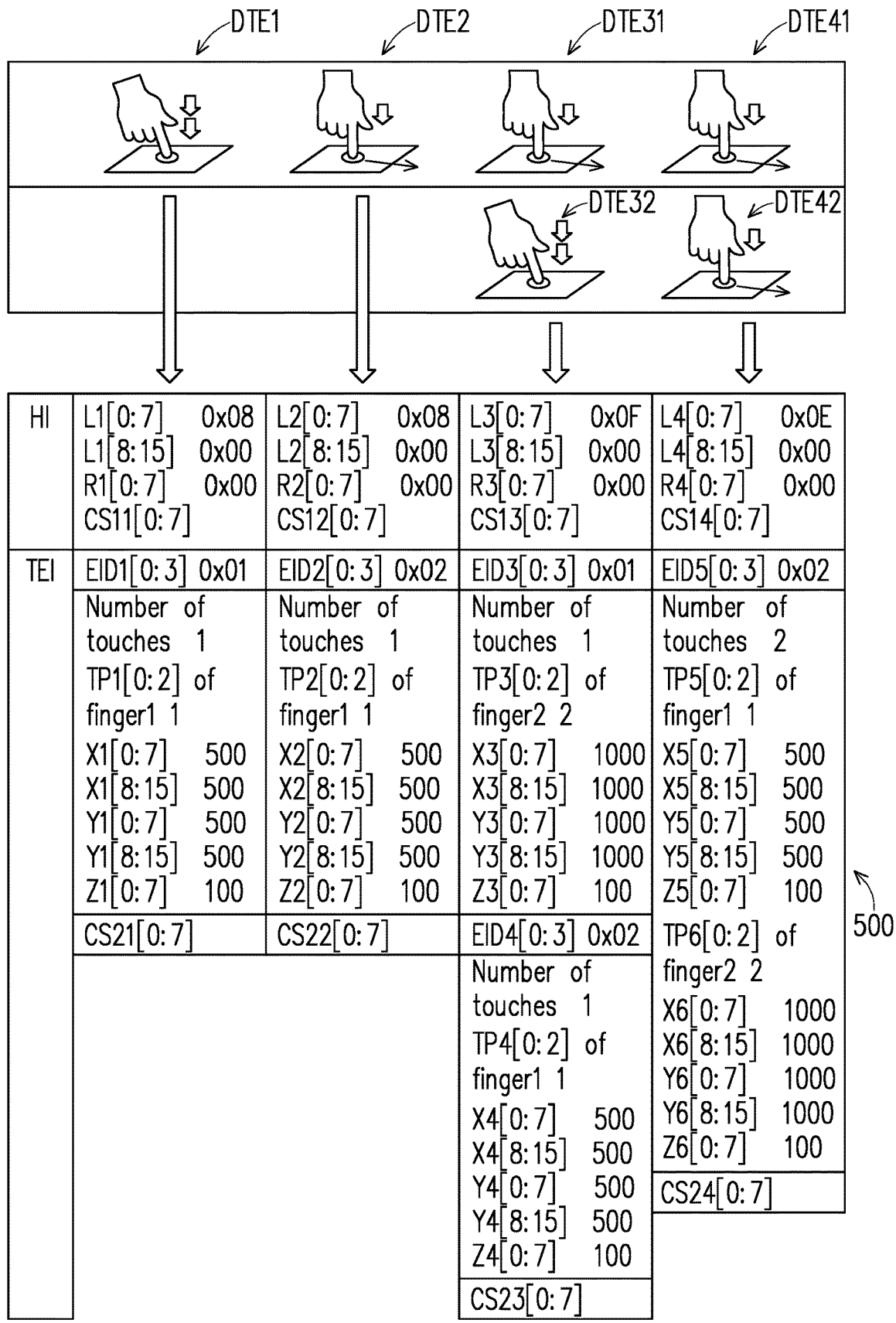
FIG. 5 illustrates a schematic diagram of data format of header information and touch event information according to an embodiment of present disclosure.

Please refer to FIG. 5, which illustrates a schematic diagram of data format of header information and touch event information according to an embodiment of present disclosure. In FIG. 5, a memory 500 may be used to record header information HI and touch event information TEI corresponding to a plurality of detected touch events DTE1 to DTE42. In this embodiment, and user triggers the detected touch event DTE1 by touch down a first finger to a touch control panel. Corresponding to the detected touch event DTE1, the header information HI has two length bytes L1[0:7] and L1[8:15] which are 0x08 and 0x00 respectively, for recording data length of the corresponding touch event information TEL The header information HI further has a reserve byte R1[0:7] equals 0x00. Based on the length bytes L1[0:7] and L1[8:15] and the reserve byte R1[0:7], a checksum information CS11[0:7] with 8 bits can be generated. Corresponding to the detected touch event DTE1, the touch event information has an event information EID1[0:3] for recording the type of the detected touch event DTE1. In this embodiment, the event information EID1[0:3] may be 0x01 for indicating a touch down event by the user. Furthermore, the touch information TEI of the detected touch event DTE1 also includes number of touches, touch type of finger 1 TP1[0:2], position information X1[0:7], X1[8:15], Y1[0:7], Y1[8:15] and Z1[0:7]. The position information X1[0:7], X1[8:15], Y1[0:7], Y1[8:15] may be coordinate values of X-axis and Y-axis of touch point, and the position information Z1[0:7] may be a size of the touch point. In this embodiment, corresponding to the detected touch event DTE1, the number of touches=1; the touch type of finger 1

TP1[0:2]=1; each of the position information X1[0:7], X1[8:15], Y1[0:7], Y1[8:15]=500; and the position information Z1[0:7]=100.

Based on the touch event information TEI corresponding to the detected touch event DTE1, another checksum information CS21[0:7] with 8 bits can be generated.

Besides, the user may trigger the detected touch event DTE2 by keeping touching the touch control panel with the first finger. Corresponding to the detected touch event DTE2, the header information HI has two length bytes L2[0:7] and L2[8:15] which are 0x08 and 0x00 respectively, for recording data length of the corresponding touch event information TEL The header information HI further has a reserve byte R2[0:7] equals 0x00. Based on the length bytes L2[0:7] and L2[8:15] and the reserve byte R2[0:7], a checksum information CS12[0:7] with 8 bits can be generated. Corresponding to the detected touch event DTE2, the touch event information has an event information EID2[0:3] for recording the type of the detected touch event DTE2. In this embodiment, the event information EID2[0:3] may be 0x02 for indicating a data moving event by the user. Furthermore, the touch information TEI of the detected touch event DTE2 also includes number of touches, touch type of finger 1 TP2[0:2], position information X2[0:7], X2[8:15], Y2[0:7], Y2[8:15] and Z2[0:7]. In this embodiment, corresponding to the detected touch event DTE2, the number of touches=1; the touch type of finger 1 TP1[0:2]=1; each of the position information X1[0:7], X1[8:15], Y1[0:7], Y1[8:15]=500; and the position information Z1[0:7]=100.

Based on the touch event information TEI corresponding to the detected touch event DTE2, another checksum information CS22[0:7] with 8 bits can be generated.

The user may trigger the detected touch event DTE3 by keeping touching the touch control panel with the first finger, and trigger the detected touch event DTE4 by touch down a second finger to the touch control panel at the same time. Corresponding to the detected touch events DTE3 and DTE4, the header information HI has two length bytes L3[0:7] and L3[8:15] which are 0x0F and 0x00 respectively, for recording data length of the corresponding touch event information TEL The header information HI further has a reserve byte R3[0:7] equals 0x00. Based on the length bytes L3[0:7] and L3[8:15] and the reserve byte R3[0:7], a checksum information CS13[0:7] with 8 bits can be generated. Corresponding to the detected touch event DTE3, the touch event information has an event information EID3 [0:3] (=0x01) for recording the type of the detected touch event DTE3, and corresponding to the detected touch event DTE4, the touch event information may also have an event information EID4[0:3] (=0x02) for recording the type of the detected touch event DTE4. Furthermore, the touch information TEI of the detected touch event DTE3 also includes number of touches, touch type of finger 2 TP3[0:2], position information X3 [0:7], X3 [8:15], Y3 [0:7], Y3 [8:15] and Z3 [0:7]. In this embodiment, corresponding to the detected touch event DTE3, the number of touches=1; the touch type of finger 2 TP1[0:2]=2; each of the position information X3[0:7], X3[8:15], Y3[0:7], Y3[8:15]=1000; and the position information Z3[0:7]=100. On the other hand, the touch information TEI of the detected touch event DTE4 also includes number of touches, touch type of finger 1 TP4[0:2], position information X4[0:7], X4[8:15], Y4[0:7], Y4[8:15] and Z4[0:7]. In this embodiment, corresponding to the detected touch event DTE4, the number of touches=1; the touch type of finger 1 TP1[0:2]=1; each of the position information X4[0:7], X4[8:15], Y4[0:7], Y4[8:15]=500; and the position information Z4[0:7]=100.

Based on the touch event information TEI corresponding to the detected touch events DTE3 and DTE4, another checksum information CS23[0:7] with 8 bits can be generated.

The user may further trigger the detected touch event DTE5 and DTE6 by keeping touching the touch control panel with the first finger and the second finger, respectively. Corresponding to the detected touch events DTE5 and DTE6, the header information HI has two length bytes L4[0:7] and L4[8:15] which are 0x0E and 0x00 respectively, for recording data length of the corresponding touch event information TEL The header information HI further has a reserve byte R4[0:7] equals 0x00. Based on the length bytes L4[0:7] and L4[8:15] and the reserve byte R4[0:7], a checksum information CS14[0:7] with 8 bits can be generated. Corresponding to the detected touch events DTE5 and DTE6, the touch event information has an event information EID5[0:3] (=0x02) for recording the type of the detected touch events DTE5 and DTE5 Furthermore, the touch information TEI of the detected touch events DTE5 and DTE6 also includes number of touches (=2), touch type of finger 1 TP5[0:2] (=1), touch type of finger 2 TP6[0:2] (=2), position information X5[0:7], X5[8:15], Y5[0:7], Y5[8:15] and Z5[0:7] of the first finger, and position information X6[0:7], X6[8:15], Y6[0:7], Y6[8:15] and Z6[0:7] of the second finger. In this embodiment, each of the position information X5[0:7], X5[8:15], Y5[0:7], Y5[8:15]=500; the position information Z5[0:7]=100; each of the position information X6[0:7], X6[8:15], Y6[0:7], Y6[8:15]=1000; the position information Z6[0:7]=100.

Based on the touch event information TEI corresponding to the detected touch events DTE5 and DTE5, another checksum information CS24[0:7] with 8 bits can be generated.

Figure 6:
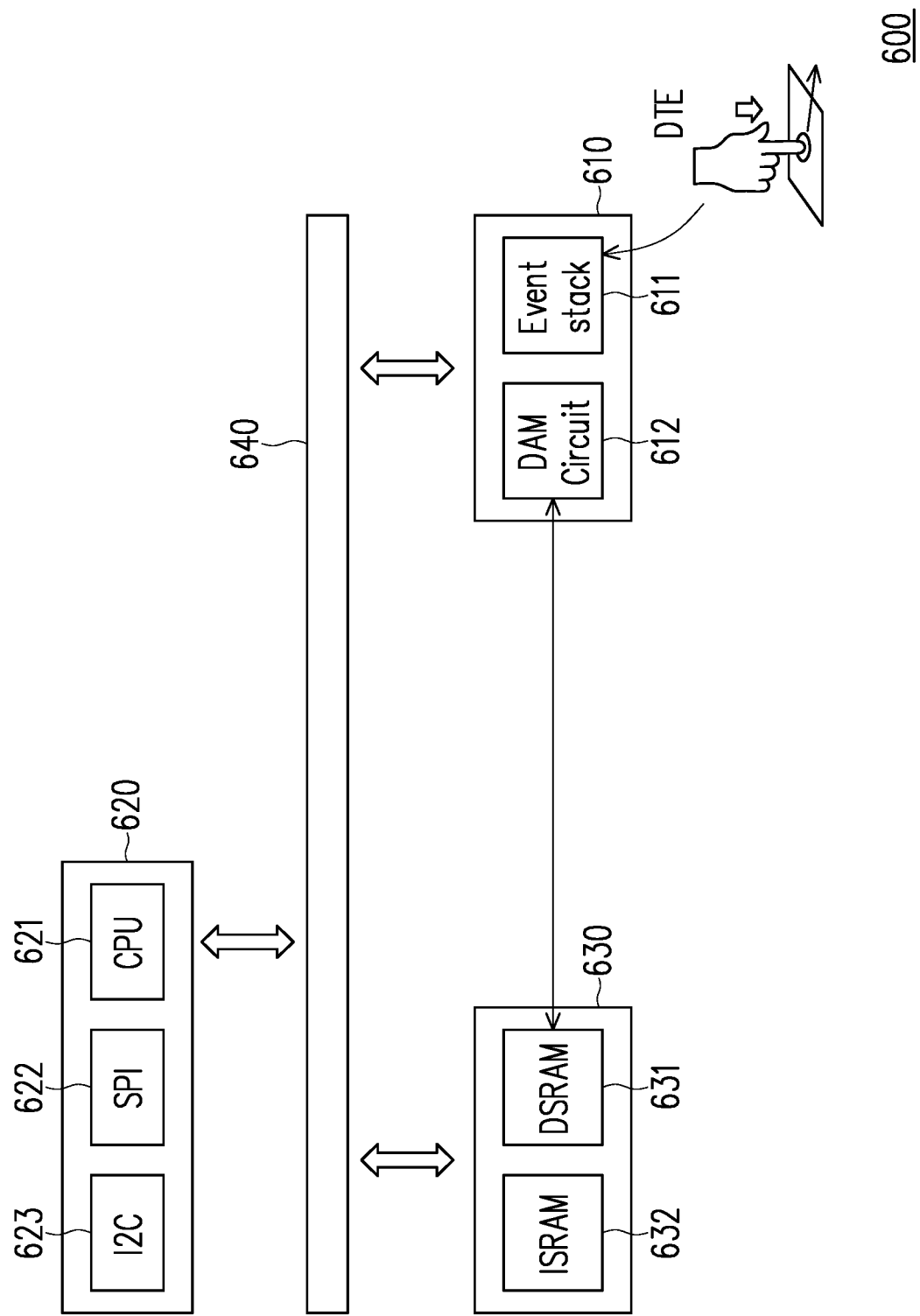
FIG. 6 illustrates a block diagram of a touch detection device according to an embodiment of present disclosure.

Please refer to FIG. 6, which illustrates a block diagram of a touch detection device according to an embodiment of present disclosure. The touch detection device 600 includes a first controller 610, a second controller 620 and a memory 630. The first controller 610 may be coupled to second controller 620 and the memory 630 through a bus 640. The first controller 610 includes an event stack 611 and a direct memory accessing (DMA) circuit 612. The event stack 611 is configured to store a plurality of detected touch events DTE. The first controller 610 may directly access the memory 630 through the DMA circuit 612.

The first controller 610 may generate header information according to each of the detected touch events DTE, and the first controller 610 may further generate checksum information according to the header information. The first controller 610 stores the header information, the checksum information and touch event information of the each of the detected touch events DTE to the memory 630. Detail operations of the first controller 610 have been described in the embodiments mentioned above, and no more repeated descriptions here.

In this embodiment, the memory 630 may includes a data memory (DSRAM) 631 and an instruction memory (ISRAM) 632. The DSRAM 631 may be used to store normal data, and the ISRAM 632 may be used to store instructions data. In this embodiment, the header information, the checksum information and the touch event information of the each of the detected touch events DTE may be stored in the DSRAM 631.

The second controller 620 includes a plurality of interfacing circuits and a central processing unit (CPU) 621. The interfacing circuits may include Inter-Integrated Circuit (I2C) 623 and Serial Peripheral Interface Bus (SPI) 622. Of course, the second controller 620 may also include other types interfacing circuits. The second controller 620 may access the memory 630 through the bus 640. In this embodiment, the bus may be an advanced high performance bus (AHB).

The second controller 620 is configured to perform the flow chart as shown in FIG. 4. Such as that, touch event information stored in the memory 630 can be access by the second controller 620 with higher efficiency.

It should be noted here, in this embodiment, the first controller 610 may be a slave controller, and the second controller 610 may be a master controller for advanced high performance bus.

In summary, present disclosure provides header information for touch data transmission scheme. By performing checksum scheme on the header information, the touch data transmission can be checked in advance, and touch event information can be obtained quickly and correctly. Such as that, an efficiency of the touch data transmission can be improved.

Based on the above, in the disclosure, the two search memory cells in the different memory cell blocks are used to form the search memory cell pair, and the search memory cell pair is used to store the storage data. In this way, when the search operation is performed, all the word lines in the memory cell block may receive the search voltage generated according to the searched data. That is to say, in one search operation, the search data length provided by the memory device in the disclosure may be increased, effectively improving the efficiency of the in-memory search operation.

What is claimed is:

1. A touch data transmission method, comprising:
generating a header information by a first controller according to a detected touch event;
summing the header information bytewise to obtain a first logic value by the first controller;
picking up a preset bit length of the first logic value to obtain a second logic value by the first controller; and
subtracting a preset logic value by the second logic value to generate a first checksum information by the first controller;
storing the header information and the first checksum information to a memory by the first controller; and
storing a plurality of position information of the detected touch event to the memory by the first controller.

2. The touch data transmission method according to claim 1, further comprising:
generating second checksum information according to the plurality of position information by the first controller; and
storing the second checksum information into the memory by the first controller.

3. The touch data transmission method according to claim 1, further comprising:
storing touch type information and number of touch point of the detected touch event to the memory by the first controller.

4. The touch data transmission method according to claim 1, further comprising:
reading the header information and the first checksum information from the memory by a second controller;
performing a first checksum operation according to the header information and the first checksum information to determine whether the header information is normal or not; and reading the plurality of position information of the detected touch event from the memory by the second controller when the header information is determined to be normal.

5. The touch data transmission method according to claim 4, further comprising:
performing a second checksum operation according to the plurality of position information and second checksum information to determine whether the plurality of position information is normal or not.

6. A touch detection device, comprising:
a memory; and
a first controller, coupled to the memory, wherein the first controller is configured to:
generate a header information according to a detected touch event;
sum the header information bytewise to obtain a first logic value;
pick up a preset bit length of the first logic value to obtain a second logic value:
subtract a preset logic vale by the second logic value to generate a first checksum information;
store the header information and the first checksum information to the memory; and
store a plurality of position information of the detected touch event to the memory.

7. The touch detection device according to claim 6, wherein the first controller is further configured to:
generate second checksum information according to the plurality of position information; and
store the second checksum information into the memory.

8. The touch detection device according to claim 6, wherein the first controller is further configured to:
store touch type information and number of touch point of the detected touch event to the memory.

9. The touch detection device according to claim 6, further comprising:
a second controller, coupled to the memory through a bus, wherein the second controller is configured to:
read the header information and the first checksum information from the memory;
perform a first checksum operation according to the header information and the first checksum information to determine whether the header information is normal or not; and
read the plurality of position information of the detected touch event from the memory when the header information is determined to be normal.

10. The touch detection device according to claim 9, wherein the bus is an advanced high performance bus.

11. The touch detection device according to claim 9, wherein the second controller is further configured to:
perform a second checksum operation according to the plurality of position information and second checksum information to determine whether the plurality of position information is normal or not.

12. The touch detection device according to claim 6, wherein the first controller comprises:
an event stack, for storing a plurality of touch events; and
a direct memory access circuit, coupled to the memory, for accessing the memory to obtain the header information, the first checksum information and the plurality of position information directly.

* * * * *